United States Patent
Nyboe et al.

(10) Patent No.: US 7,889,011 B2
(45) Date of Patent: Feb. 15, 2011

(54) OUTPUT SHORT CIRCUIT AND LOAD DETECTION

(75) Inventors: Flemming Nyboe, Bronshoj (DK); Klaus Krogsgaard, Lyngby (DK)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 12/165,519

(22) Filed: Jun. 30, 2008

(65) Prior Publication Data
US 2009/0322426 A1 Dec. 31, 2009

(51) Int. Cl.
*H03F 1/52* (2006.01)
(52) U.S. Cl. ............................. 330/298; 330/251
(58) Field of Classification Search ............ 330/207 A, 330/207 P, 251, 298
See application file for complete search history.

(56) References Cited

U.S. PATENT DOCUMENTS

| | | | |
|---|---|---|---|
| 7,224,218 B1 * | 5/2007 | Jiang et al. | 330/10 |
| 7,554,409 B1 * | 6/2009 | Zhang et al. | 330/298 |
| 2005/0122168 A1 * | 6/2005 | Mazda | 330/251 |
| 2009/0174485 A1 * | 7/2009 | Teng et al. | 330/298 |

OTHER PUBLICATIONS

Texas Instruments Incorporated, 100 W Stereo Digital Amplifier Power Stage, TAS5342 data sheet, Sep. 2007, www.ti.com, USA.
Texas Instruments Incorporated, 100 W Stereo Digital Amplifier Power Stage, TAS5342L data sheet, Oct. 2007, www.ti.com, USA.
Texas Instruments Incorporated, 125 W Stereo Digital Amplifier Power Stage, TAS5352 data sheet, Sep. 2007, www.ti.com, USA.

* cited by examiner

*Primary Examiner*—Khanh V Nguyen
(74) *Attorney, Agent, or Firm*—John J. Patti; Wade J. Brady, III; Frederick J. Telecky, Jr.

(57) ABSTRACT

One embodiment of an apparatus for testing an amplifier includes an amplifier having a driver and a filter, the filter being connected between an output of the driver and an output of the amplifier. The filter is operable to produce a demodulated output signal from a higher frequency modulated signal at the driver output. The apparatus also includes a voltage level detector connected to the driver output and a control circuit operable to detect at least one fault based on a voltage level measured at the driver output by the voltage level detector.

15 Claims, 5 Drawing Sheets

OUTPUT SHORT CIRCUIT AND LOAD DETECTION

BACKGROUND OF THE INVENTION

Various types of electronic amplifiers exist for amplifying an electrical signal using one or more output devices such as transistors. Electronic amplifiers are commonly grouped into several classifications based on how they fundamentally operate and how they conduct electricity over the different portions of the input cycle. Class A amplifiers have one or more output transistors that conduct in their linear range over the entire cycle or waveform of the input signal. Class A amplifiers produce a high quality output but are extremely inefficient. The output transistors in a class A amplifier may continue to conduct a DC current even if the input signal is off. Class B amplifiers have two complementary output transistors or sets of output transistors, each of which conducts in the linear range for half of the input cycle and is substantially off for the other half of the input cycle. A class B amplifier is much more efficient than a class A amplifier, but is susceptible to crossover distortion when switching from one output transistor to the other. Because it takes a small but significant amount of voltage for the output transistors to start conducting, portions of the input waveform that have a lower voltage than this turn-on voltage will not be reproduced faithfully by the class B amplifier. Class AB amplifiers combine some features of both class A and class B amplifiers in order to minimize or eliminate crossover distortion while sacrificing some efficiency. The output transistors in a class AB amplifier do not turn off during their inactive phase, but are biased so that they continue to conduct just enough to remain turned on during their inactive phase. While frequently used, all of these amplifier classes that operate in their linear ranges for all or some of the input cycle are relatively inefficient. For example, the theoretical limit on efficiency in these amplifier classes is about 78.5% or $\pi/4$.

As signal processing techniques have improved, class D amplifiers have seen increased use. The output transistors in class D amplifiers operate in switching mode, with the transistors either turned on or off in their most efficient states. The input signal is encoded or modulated in the switched signal produced by the output transistors. In one modulation technique, the input signal is pulse-width modulated by the class D amplifier. The output signal produced by the class D amplifier has a constant amplitude and frequency, but the width of each pulse is varied based on the amplitude of the input signal. The switching rate establishes a sampling frequency that is typically many times greater than the frequency of the input signal in order to capture the significant information. The output signal may be recovered or demodulated by passing it through a passive LC lowpass filter that effectively averages the PWM signal out. Considered at the switching frequency of the class D amplifier, the output of the lowpass filter appears to be a low frequency signal having an amplitude that is proportional to the duty cycle of the PWM output. Considered at lower frequencies, the output signal may appear as an analog signal having a widely varying amplitude, such as with the case of an audio signal. The class D amplifier is an attractive option because it is much more efficient than other amplifiers such as class A, class B or class AB amplifiers. The theoretical maximum efficiency of a class D amplifier is 100%, with actual efficiencies of over 90% depending on the application. Class D amplifiers are therefore used in a wide range of applications, such as audio amplifiers, motor control systems and other power conversion systems. This efficiency also results in lower cooling requirements, reducing the size and cost of cooling fins and housings for the amplifiers.

Short circuits between pins of integrated circuits (IC's) can occur due to placement and soldering errors during manufacturing of the product in which the IC is used. For class D audio amplifier IC's, if such a short circuit is present between an output pin and a power supply pin, it often causes irreparable damage to the IC when first powered up. Solutions exist for detecting circuit faults after the lowpass filter at the output of a class D amplifier. However, circuit faults at the output of the output transistors of a class D amplifier and before the lowpass filter can cause damage to the amplifier and associated devices because they are undetected by conventional circuit fault detection solutions. Furthermore, conventional methods of detecting loads, such as those used in class AB amplifiers, are ineffectual at detecting a load connected to the output of a class D amplifier.

Hence, for at least the aforementioned reasons, there exists a need in the art for a method and apparatus for detecting output short circuits and loads in a class D amplifier.

BRIEF SUMMARY OF THE INVENTION

The present invention is related to detecting short circuits and loads in an electronic circuit, and in particular to detecting short circuit conditions between the output transistors and passive LC filter of a class D amplifier and to detecting a load connected to the output of a class D amplifier.

Some embodiments of the present invention provide apparatuses for testing an amplifier. One particular embodiment includes an amplifier having a driver and a filter, the filter being connected between an output of the driver and an output of the amplifier. The filter is operable to produce a demodulated output signal from a higher frequency modulated signal at the driver output. The apparatus also includes a voltage level detector connected to the driver output and a control circuit operable to detect at least one fault based on a voltage level measured at the driver output by the voltage level detector.

Other embodiments of the present invention provide methods of testing an amplifier. One particular embodiment of a method for testing an amplifier includes applying power to a high side gate driver in a class D amplifier, measuring the voltage level at a test node at an output of an output stage driver and an input of an output filter, and determining a presence of at least one type of fault associated with the class D amplifier based at least in part on the voltage level measured at the test node.

Yet other embodiments of the present invention provide an audio device. One particular embodiment of an audio device according to the present invention includes a class D amplifier having a driver and a filter. The filter is connected between an output of the driver and an output of the amplifier and is operable to produce a demodulated output signal from a higher frequency modulated signal at the driver output. The amplifier also includes a voltage level detector connected to the driver output and a pulldown switch connected between the driver output and a lower power supply rail. The amplifier further includes a control circuit operable to detect at least one fault based on a voltage level measured at the driver output by the voltage level detector. The control circuit is further operable to detect whether a short to the lower power supply rail prevents the voltage level at the driver output from rising above a reference voltage level due to power applied to the driver. The control circuit is further operable to turn on the pulldown switch to pull the driver output down to the lower power supply rail and to determine whether the driver output is held above the reference voltage level by a short to an upper power supply rail.

This summary provides only a general outline of some embodiments according to the present invention. Many other objects, features, advantages and other embodiments of the present invention will become fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components.

DETAILED DESCRIPTION OF THE INVENTION

The present invention is related to detecting short circuits and loads in an electronic circuit, and in particular to detecting short circuit conditions at the output of the output transistors both before and after the passive LC filter of a class D amplifier and to detecting a load connected to the output of a class D amplifier. Circuits and methods are disclosed which detect short circuits on output pins of a class D amplifier IC during power up. Although the detection circuits herein are described with respect to a class D amplifier, it is important to understand that the detection circuits may be adapted for use in any suitable electronic circuit. The detection circuits disclosed herein are thus not limited to use in a class D amplifier or even to use in an amplifier of any particular type, such as in a switched mode power supply or voltage regulator IC. The detection circuits disclosed herein may be included in any suitable circuit to detect short circuits between output pins and power supply pins, and if a short circuit is found, the detection circuit will disable or otherwise prevent the IC from starting, protecting it from damage. The disabled IC will not be functional, and if a functional test is performed, the IC will fail the test. However, because damage to the IC is prevented by disabling it, the IC will be functional once the short circuit is located and removed. Short circuit detection thus makes the problem of output pin short circuits repairable instead of irreparable. The detection circuits disclosed herein may further be used to detect the presence of a load connected to the output of the amplifier or other suitable circuit.

Figure 1:
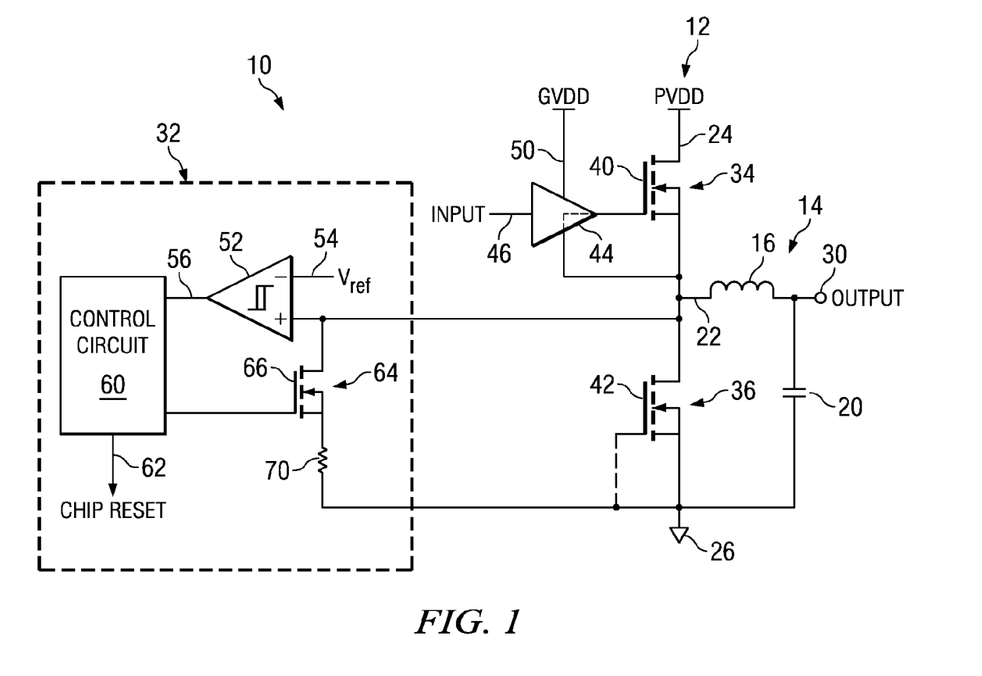
FIG. 1 is a schematic diagram of a short circuit detection circuit that may be used in a class D amplifier for detecting short circuits between an output and power supply rails according to one particular embodiment of the invention.

Referring now to FIG. 1, a portion 10 of a class D amplifier is shown including an output stage 12 and a passive LC filter 14. The output stage 12 represents a general class D half bridge output stage and may be adapted as desired to other configurations. It can either serve as one single-ended amplifier channel, or as one half of a bridge-tied load or H-bridge amplifier channel. In an IC or chip version of an amplifier, the LC filter 14 is typically composed of a discrete inductor 16 and capacitor 20 located outside of the IC. Improperly applied solder at the pins of the IC may short between the switching output 22 and the power supply rails, such as the output stage upper power supply rail PVDD 24 or lower power supply rail GND 26.

A short and load detection circuit 32 is provided for the class D amplifier or other suitable electronic circuit that is capable of detecting shorts between the switching output 22 and the power supply rails 24 and 26 before the amplifier enters normal operation to protect it from damage. Note that the detection circuit 32 is also effective at detecting short circuits between the speaker terminal output 30 and power supply rails because the inductor 16 provides a DC current path. The detection circuit 32 may be provided inside the amplifier or other IC. The detection circuit 32 may further be used to detect a load connected to the output 30 of the class D amplifier. A dual purpose is thereby served by one circuit with a relatively low complexity and chip area consumption. The detection circuit 32 eliminates the need for large time constants and saves chip area. When the chip is powered up, the detection circuit 32 senses short circuited output pins and prevents the chip from starting if a short circuit is detected. The detection circuit 32 tests for short circuits when power is applied to the output stage 12 without actually driving a signal through the amplifier, so that a short circuit may be detected before the amplifier is fully started, preventing damage to the chip from the short circuit. The detection circuit 32 has the added benefit of being able to detect a load, with both detection types taking place during power up rather than during normal operation.

Before continuing to describe the detection circuit 32 in more detail, the output stage 12 and LC filter 14 of an exemplary class D amplifier in which the detection circuit 32 may be used will be described. The output stage 12 is used to drive a high frequency modulated signal such as a PWM signal to the switching output 22, and the LC filter 14 acts as a lowpass filter to demodulate the PWM signal to produce a lower frequency demodulated signal such as an audio signal. This may be used, for example, to drive a load such as a speaker connected to the output 30 of the LC filter 14. The output stage 12 may include a totem pole of transistors 34 and 36 connected in series between an upper power supply rail PVDD 24 and a lower power supply rail GND 26. The transistors 34 and 36 may comprise any suitable type of transistor, and each may in fact comprise multiple grouped transistors. In one particular embodiment, the transistors 34 and 36 comprise N-channel metal oxide semiconductor field effect transistors or N-channel MOSFETS. The gates 40 and 42 of the transistors 34 and 36 are driven by a PWM signal provided by gate drivers such as a high side gate driver 44 driving the high side transistor 34 and a low side gate driver (not shown) driving the low side transistor 36. The gate drivers (e.g., 44) may have any suitable structure, and in one particular embodiment, each comprises a totem pole of transistors. The high side gate driver 44 is driven by a modulated input signal 46, such as a PWM audio signal, and the low side gate driver may be driven by an inverted modulated input signal in phase opposition to the first modulated input signal 46. The modulated input signal 46 for the high side gate driver 44 is often supplied by a level shifter, because the local ground reference or lower power supply rail for the high side gate driver 44 is the switching output 22 as illustrated in FIG. 1, while the upper power supply rail GVDD 50 may be a power supply independent of the output stage 12 upper power supply rail PVDD 24. Thus, the totem pole of transistors for the high side gate driver 44 is connected between GVDD 50 and the switching output 22. The inverted modulated input signal for the low side gate driver may also be supplied by a level shifter for symmetry with the high side, although the local ground reference for the low side gate driver is GND 26. The modulated input signals (e.g., 46) may be supplied by any suitable modulator circuit, either analog or digital.

The detection circuit 32 includes a voltage level detector such as a comparator 52 that measures the voltage level at the output 22 in comparison with a reference voltage 54. Power is applied to the high side gate driver 44 by GVDD 50 and the output stage 12 transistors 34 and 36 are turned off, for example by an external reset circuit. A current from GVDD 50 through the high side gate driver 44 travels through the inductor 16 and capacitor 20 to GND 26, tending to charge the capacitor 20 and raise the voltage level of the output 22. In a first stage short circuit test, the detection circuit 32 checks for a short circuit from the output 22 to GND 26 using the comparator 52 to monitor the output 22 for this expected rise in voltage. In the absence of a short circuit between the output 22 and GND 26, the voltage level is expected to rise above a certain voltage level, with the reference voltage 54 set appropriately. The actual expected voltage level at the output 22 depends on a number of design factors, including the quiescent current of the high side gate driver 44, whether anything is connected to the output 30, power supply levels, IC process technology, etc. In one particular embodiment, the reference voltage 54 is set to 1.5 volts.

As the voltage level of the output 22 rises to the expected level above the reference voltage 54, the comparator 52 produces an output 56 indicating that the voltage level of the output 22 has exceeded the reference voltage 54 as expected for proper operation. If, however, a short circuit exists between the output 22 and GND 26, the voltage level of the output 22 will be held low by the short circuit and will not rise above the reference voltage 54. The output 56 of the comparator 52 will indicate this fault state. A control circuit 60 monitors the output 56 of the comparator 52 and may be used to disable the IC containing the amplifier, for example by holding the chip reset 62 in an asserted state. If a short circuit is detected, the IC is thereby protected by preventing it from attempting to drive a shorted output pin until power is removed and the short circuit is repaired. In another exemplary embodiment, the control circuit 60 may disable just the short circuited output stage rather than the entire IC if a short circuit is detected.

The detection circuit 32 also includes a pulldown switch such as a pulldown transistor 64 connected between the output 22 and GND 26. The gate 66 of the pulldown transistor 64 is controlled by the control circuit 60. A current limiting resistor 70 may also be included if desired between the pulldown transistor 64 and GND 26. The optional resistor 70 aids in controlling the current through the pulldown transistor 64 across process and temperature variations. However, if the pulldown transistor 64 can be sized and controlled reliably, the resistor 70 may be omitted. In a second stage short circuit test, the detection circuit 32 checks for a short circuit from the output 22 to PVDD 24. Note that if a short circuit exists between the output 22 and PVDD 24, the system will still have passed the first stage short circuit detection described above, because the short from the output 22 to PVDD 24 will have joined with the current through the high side gate driver 44 to pull the output 22 above the reference voltage 54. However, the second stage short circuit test will detect this condition. The control circuit 60 turns on the pulldown transistor 64, pulling the output 22 down toward GND 26. (Note that the phrase "pulling down toward GND 26" refers to electrically connecting the output 22 to a lower power supply rail such as GND 26 through the pulldown transistor 64, and does not necessarily mean that the output 22 reaches the same voltage potential as GND 26.) If the pulldown transistor 64 is able to pull the output 22 back down below the reference voltage 54, then no short circuit exists between the output 22 and PVDD 24. The pulldown transistor 64 is a small transistor, sized small enough so that it would not be able to discharge the PVDD 24 power supply if it were shorted to the output 22 but large enough that if no short circuit exists between the output 22 and PVDD 24 it is capable of pulling the output 22 down close to the GND 26 potential or at least below the reference voltage 54. In other words, the current that the pulldown transistor 64 can sink should be greater than the quiescent current of the high side gate driver 44, because the high side gate driver 44 will still be working against the pulldown transistor 64 to pull up the voltage at the output 22. There is typically a wide margin between the quiescent current of the high side gate driver 44 and the current sourcing capacity of the upper power supply rail PVDD 24, and the sizing of the pulldown transistor 64 is selected so that its current sinking capacity falls within this margin. Note that the capacitor 20 will also be discharged through the transistor 64 during the second stage short circuit test from the voltage level it achieved during the first stage short circuit test. The capacitor 20 does not affect the outcome of the tests, but does affect the time it takes to pass the detection in each stage of the short circuit detection. It is important to note that the control circuit 60 does not need to manage the timing of the short circuit and load detection tests. The control circuit 60 waits for power to be applied to the output stage 12 and the high side gate driver 44 by an external source, and runs the detection when power has been applied. This waiting is inherent because if GVDD 50 is not applied, no current flows into the high side gate driver 44 to charge the output 22 above the reference voltage 54. If PVDD 24 is not applied, the body diode of the high side output transistor 34 will prevent the output 22 from increasing beyond about 0.7V, and hence above the set reference voltage 54.

The voltage level of the output 22 is thus expected to fall below the reference voltage 54 when the pulldown transistor 64 is turned on, and the comparator 52 is used to monitor the output 22 for this expected decrease in voltage. If no short circuit between the output 22 and PVDD 24 exists, the voltage level of the output 22 will decrease and the comparator 52 produces an output 56 indicating that the voltage level of the output 22 has fallen below the reference voltage 54 as expected for proper operation. If, however, a short circuit exists between the output 22 and PVDD 24, the voltage level of the output 22 will be held high by the short circuit and will not fall below the reference voltage 54. The output 56 of the comparator 52 will indicate this fault state. The control circuit 60 monitors the output 56 of the comparator 52 and may be used to disable the IC containing the amplifier, for example by holding the chip reset 62 in an asserted state. If a short circuit is detected, the IC is thereby protected by preventing it from attempting to drive a shorted output pin until power is removed and the short circuit is repaired. Once the detection circuit 32 has performed and passed the first and second stage short circuit tests, then for this half bridge or channel it is confirmed that there is neither a short to GND 26 or PVDD 24 from the output 22. If the amplifier or other circuit includes more than one channel, the detection circuit for each channel performs the first and second stage short circuit tests described above before starting the amplifier or the output stages of the amplifier. In one particular embodiment, if any channel fails a test, none of the channels are allowed to start.

Figure 2:
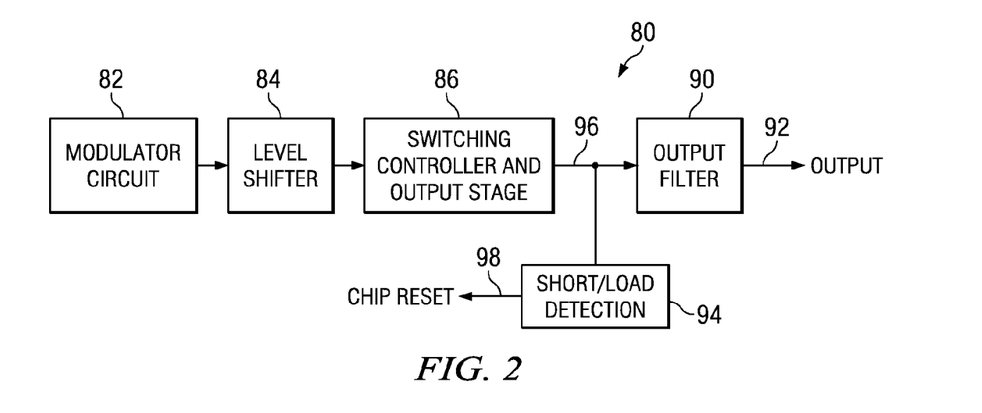
FIG. 2 is a schematic diagram of a class D amplifier in which the detection circuit according to one particular embodiment of the invention may be included.

Before continuing to describe the operation of a short circuit detection circuit to detect a load connected to the output 30 of the amplifier, an exemplary class D amplifier in which the detection circuit 32 may be used will be briefly described. However, it is important to note that the detection circuit 32 is not limited to use with any particular amplifier circuit or other type of electronic circuit. Referring now to FIG. 2, one particular embodiment of a class D amplifier 80 includes a modulator circuit 82 that supplies a modulated carrier signal to a level shifter 84. The level shifted modulated signal from the level shifter 84 supplies a switching controller and output stage 86, and an output filter 90 demodulates the signal from the switching controller and output stage 86 to produce an amplified signal at the output 92. A short circuit and load detection circuit 94 monitors and manipulates the switching output 96 of the switching controller and output stage 86 to detect short circuits between the switching output 96 and power or ground, and may assert the chip reset 98 if a short circuit is detected. The switching controller and output stage 86 includes the gate drivers (e.g., 44) and output stage transistors (e.g., 34 and 36) described above, and the output filter 90 represents the LC filter 14 described above. The modulator circuit 82 may have any suitable inputs such as an audio input, clock input, triangle wave input, etc. For example, in one particular embodiment, the modulator circuit may comprise a comparator that compares an audio signal with a high frequency triangle wave. The class D amplifier 80 may also include one or more feedback loops as is known, for example from the switching output back to the modulator circuit. Because class D amplifiers may have a great variety of configurations and the short and load detection circuits disclosed herein are not limited to use with any particular class D amplifier or even any particular electronic circuit, the exemplary class D amplifier 80 that may include a short and load detection circuit 94 will not be described in further detail herein.

Figure 3:
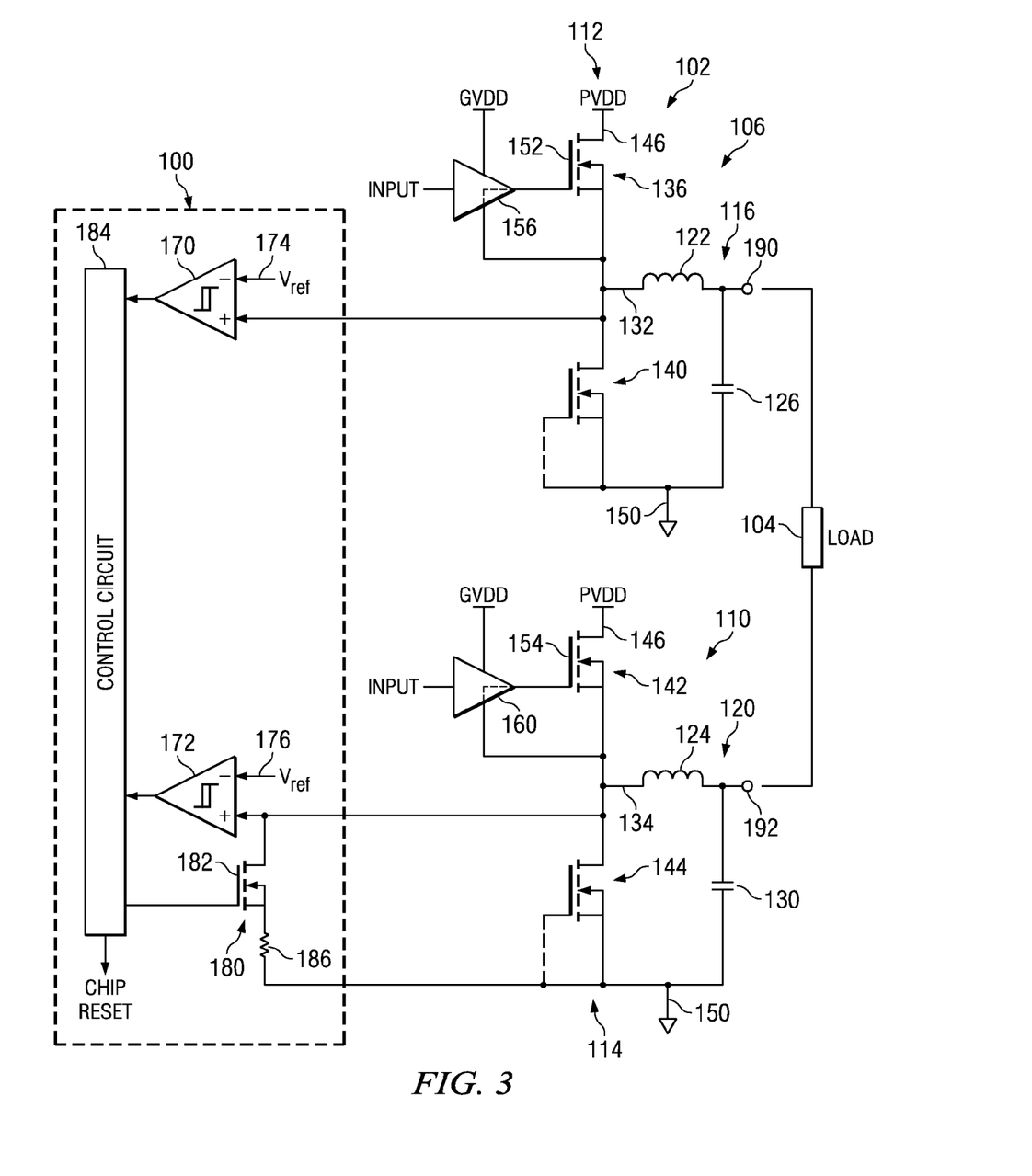
FIG. 3 is a schematic diagram of a detection circuit for detecting a load between two half-bridge outputs according to one particular embodiment of the invention.

Referring now to FIG. 3, a short circuit and load detection circuit 100 for an H-bridge amplifier 102 will be described. Note that the short circuit and load detection circuit 100 requires no additional circuitry over the short detection circuit 32 described above, other than some additional control circuitry to control and monitor the load detection operation. Load detection is useful for detecting whether a load such as a speaker is connected to the circuit. For example, in the automotive industry the load detection may be performed during production testing of an automobile to ensure that all speakers in the automobile have been correctly connected to the audio system. In this embodiment, a load 104 may be connected between two half bridges 106 and 110. Each half bridge 106 and 110 includes an output stage 112 and 114 and a passive LC filter 116 and 120, respectively. As with previous embodiments, the output stages 112 and 114 represent a general class D half bridge output stage and may be adapted as desired to other configurations. The LC filters 116 and 120 include a discrete inductor 122 and 124 and capacitor 126 and 130, respectively, located outside of the IC. The output pins of the IC are connected to the switching outputs 132 and 134 of the two half bridges 106 and 110. The output stages 112 and 114 each include a totem pole of transistors 136 and 140, 142 and 144 connected in series between an upper power supply rail PVDD 146 and a lower power supply rail GND 150. The gates 152 and 154 of the high side transistors 136 and 142 are driven by a PWM signal provided by high side gate drivers 156 and 160, respectively. As with previous embodiments, low side transistors 140 and 144 are driven by low side gate drivers, not shown.

The load detection circuit 100 includes a voltage level detector such as a comparator 170 and 172 for each half bridge 106 and 110, that measure the voltage levels at the switching outputs 132 and 134 in comparison with reference voltages 174 and 176, respectively. (In practice, reference voltages 174 and 176 may comprise a single voltage source, although as will be discussed below, they may also comprise separate sources to provide different voltage levels to each half bridge 106 and 110 for additional optional tests.) At least one of the half bridges (e.g., 110) is provided with a pulldown switch such as a pulldown transistor 180 connected between the switching output 134 and GND 150. The gate 182 of the pulldown transistor 180 is controlled by the control circuit 184. An optional current limiting resistor 186 may also be included if desired between the pulldown transistor 180 and GND 150. Load detection is based on the fact that a typical load 104 connected between the two half bridges 106 and 110 creates a DC current path between the switching outputs 132 and 134. Thus, by pulling the switching output 134 and the capacitor 130 down from its charged state in one half bridge 110, if a load 104 is connected the switching output 132 in the other half bridge 106 will also be pulled down via the DC current path through the load 104. For a typical audio amplifier, the load 104 consists of a very low impedance speaker and can essentially be considered to be a short circuit between the output nodes 190 and 192 of the LC filters 116 and 120.

The load detection stage is run after the first stage short circuit detection, and before or in conjunction with the second stage short circuit detection. After running the first stage short circuit detection on each of the two half bridges 106 and 110, the load detection stage and second stage short circuit detection is run on the H-bridge amplifier 102. In another embodiment, the short circuit detection stages and load detection stage may be run in different orders, although additional precharging and discharging of the switching output nodes 132 and 134 may be needed. To run the load detection and second stage short circuit detection, the control circuit 184 turns on the pulldown transistor 180 on half bridge 110 only. (The other half bridge 106 may also have a pulldown transistor connected between its switching output 132 and GND 150 in order to run a second stage short circuit detection independent of the load detection.) The voltage level on the switching outputs 132 and 134 of both half bridges 106 and 110 is then monitored by the comparators 170 and 172 and control circuit 184 to make sure that they are pulled down by the pulldown transistor 180 directly and through the load 104. If the load 104 is not connected, the pulldown transistor 180 will pull down the switching output 134 of its half bridge 110 but not the switching output 132 of the opposite half bridge 106. The control circuit 184 is simplified by monitoring the voltage levels of both switching outputs 132 and 134 as in the second stage short circuit detection described above and failing the load detection test if the voltage level on any switching output 132 or 134 does not fall below the reference voltage 174 or 176. Thus, the control circuit 184 may share control logic between the load detection stage and the second stage short circuit detection by running them in conjunction. The only difference needed in the control circuit 184 is to pull down only the pulldown transistor 180 for one of the half bridges 106 and 110 when running the load detection stage as well as the second stage short circuit detection.

The specific design of the control circuits 60 and 184 may be adapted as desired based on the desired details for the short and load detection stages and the desired results. For example, the control circuits 60 and 184 may start half bridges that pass short circuit detection, or the control circuits 60 and 184 may disable the entire IC until they all pass all tests. The control circuits 60 and 184 may run load detection automatically before or after short circuit detection, or only on demand. The control circuits 60 and 184 may comprise any suitable circuitry for performing the desired functions as described above, such as for example a logic state machine to move from one detection stage to another, logic gates to control pulldown switches and monitor comparator outputs, etc. The control circuit 60 waits for stage one to pass by detecting that the voltage at the output 22 has increased above the reference voltage 54. If there is a short from the output 22 to GND 26, the amplifier will not pass this stage. Once the amplifier does pass stage one, the control circuit 60 turns on the pulldown transistor 64 and waits for stage two to pass by detecting that the voltage at the output 22 has decreased below the reference voltage 54. If there is a short from the output 22 to PVDD 24, the amplifier will not pass this stage. Once the amplifier does pass stage two, it releases the reset on the half bridge that passed the test or on the IC, as desired. Again, the short circuit and load detection is self-driven with no management of timing needed by the control circuit 60. If the size of the output capacitor 20 causes the test to run more quickly or more slowly, no changes are needed to the control circuit 60.

Note that the reference voltages 54, 174 and 176 may all have the same voltage level and may stay at the same voltage level during the various short and load detection stages. In other embodiments, the reference voltages 54, 174 and 176 may have different voltage levels or may be dynamically set to different levels for the different short and load detection stages.

Figure 4:
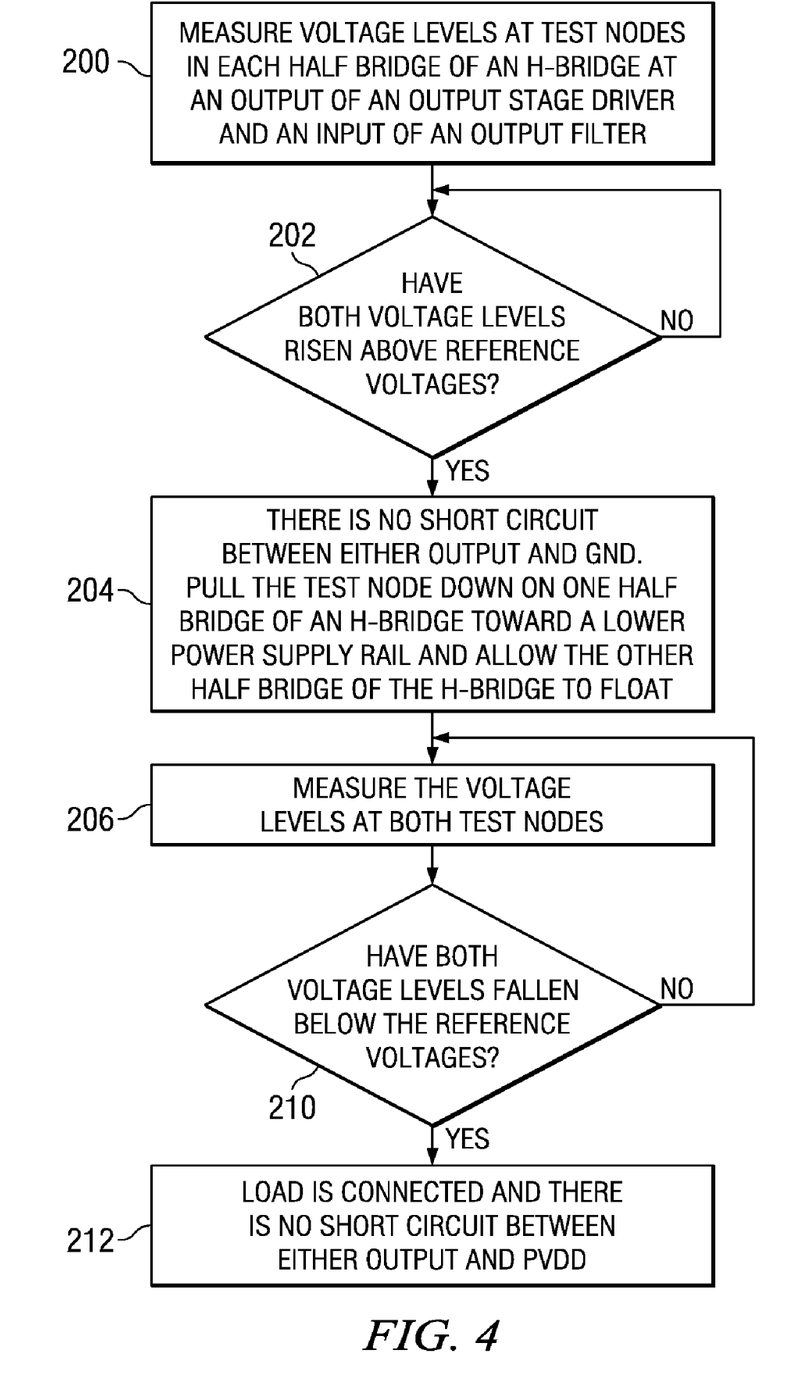
FIG. 4 is a flow chart of an exemplary operation for testing an amplifier according to one particular embodiment of the invention.

Referring now to FIG. 4, a flow chart of an exemplary method for testing an amplifier will be described. The method is directed to short and load detection in an amplifier circuit. However, as discussed above, the method is not limited to any particular type of electronic circuit. The method is run with the output transistors turned off, for example by an external reset circuit. The voltage level is measured in each half bridge of an H-bridge at a test node at an output of an output stage driver and an input of an output filter. (Block 200) As described above, this may be performed using a comparator that compares the voltage at the test node with a reference voltage to determine whether the voltage level at the test node rises above the reference voltage. (Block 202) The voltage level will not rise until power has been applied to the power supply rails for the gate drivers and output transistors. If the test node voltage does not rise above the reference voltage, a short circuit exists between the test node and the lower power supply rail or ground, and the half bridge or amplifier is held in a reset state until the test node voltage does rise in order to prevent irreparable damage to the amplifier if it attempts to drive the shorted output. If the test node voltage does rise above the reference voltage due to current flowing through the high side gate driver, the amplifier has passed the first stage of the short circuit detection and no short circuits exist between the test nodes and the lower power supply rail. Moving now to stage two of the short circuit detection, the test node of one half bridge is pulled down toward the lower power supply rail. (Block 204) The voltage levels at the test nodes are measured and compared with a reference voltage to determine whether the test node voltages fall below the reference voltage. (Blocks 206 and 210) As noted above, the reference voltage may be supplied by a single or multiple supplies as desired. If the test node voltages have fallen below the reference voltage, the amplifier has passed the second stage of the short circuit detection and the load detection indicating that a load is connected and no short circuit exists between the test node and the upper power supply rail. (Block 212) If the test node voltages do not fall below the reference voltage because either the load is not connected or a short circuit exists between at least one of the test nodes and PVDD 146, the amplifier remains disabled to prevent irreparable damage to the amplifier until the test node voltages do fall or the fault condition is repaired.

The detection may then be optionally extended in the case of a failure to determine whether the test failed because no load was connected or because of a short circuit to PVDD 146. The method to detect short circuits and a load in this particular embodiment is illustrated in the flow chart of FIG. 5. In order for the short circuit and load detection circuit 100 to distinguish between the "no load" and "out shorted to PVDD" conditions, there are three circuit prerequisites. The amplifier channel is configured in an H-bridge or other suitable coupled configuration as in FIG. 3. A pulldown circuit such as pulldown transistor 180 and resistor 186 is included in both half bridges 106 and 110. Also, the reference voltages 174 and 176 are set at different levels. For example, reference voltage 174 may be set at 2.0V in this example, and reference voltage 176 may be set at 1.5V. Note that the reference voltages used in one particular embodiment of the short circuit and load detection circuit do not have strict precision requirements, and that a simple resistive voltage divider from a supply voltage will suffice. Two resistors connected in series between the supply voltage and ground may be used to provide a single reference voltage, and three resistors connected in series between the supply voltage and ground may be used to provide two different reference voltages.

Figure 5A:
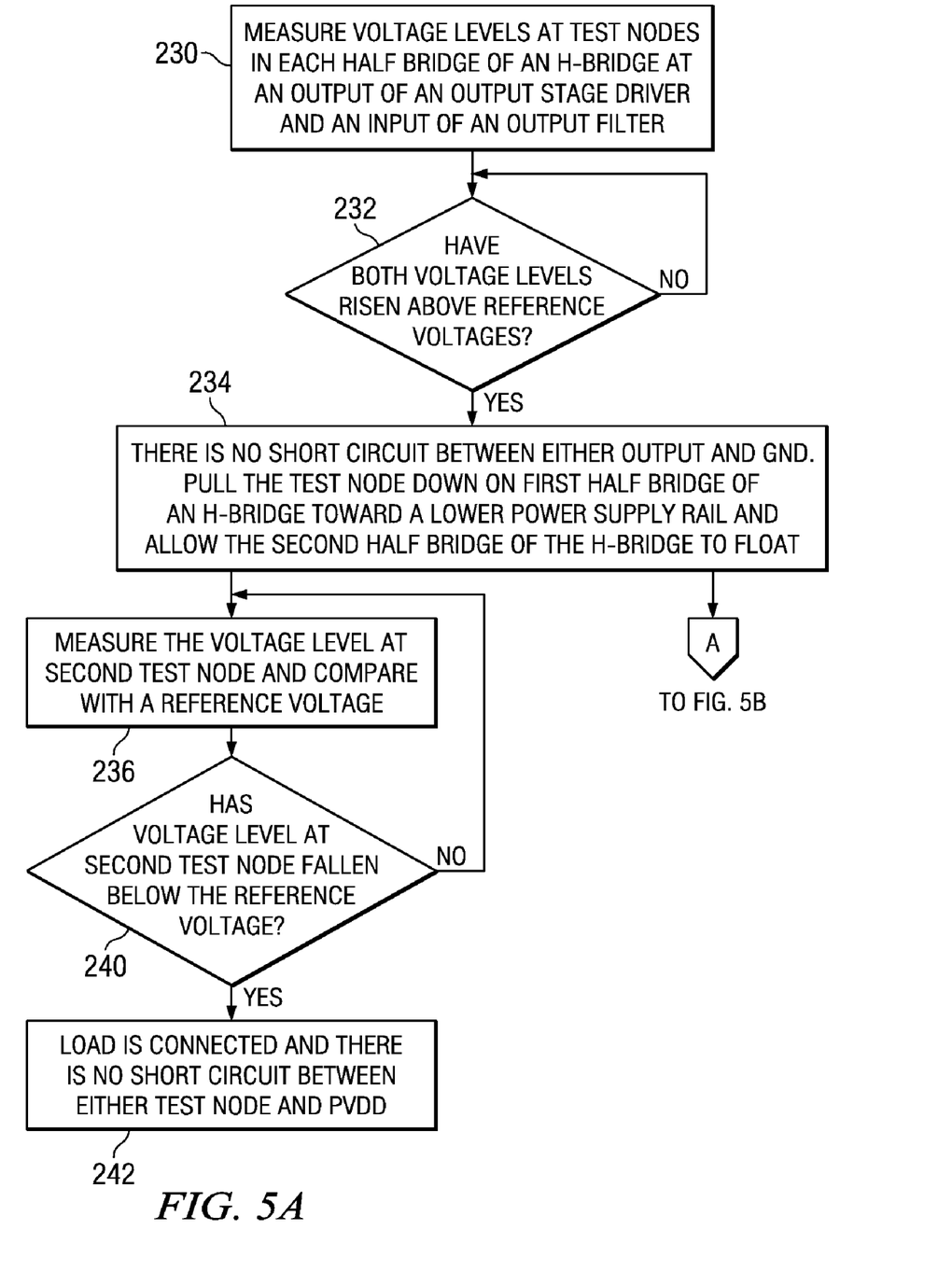
FIG. 5 is a flow chart of an exemplary operation for testing an amplifier according to another particular embodiment of the invention.
Figure 5B:
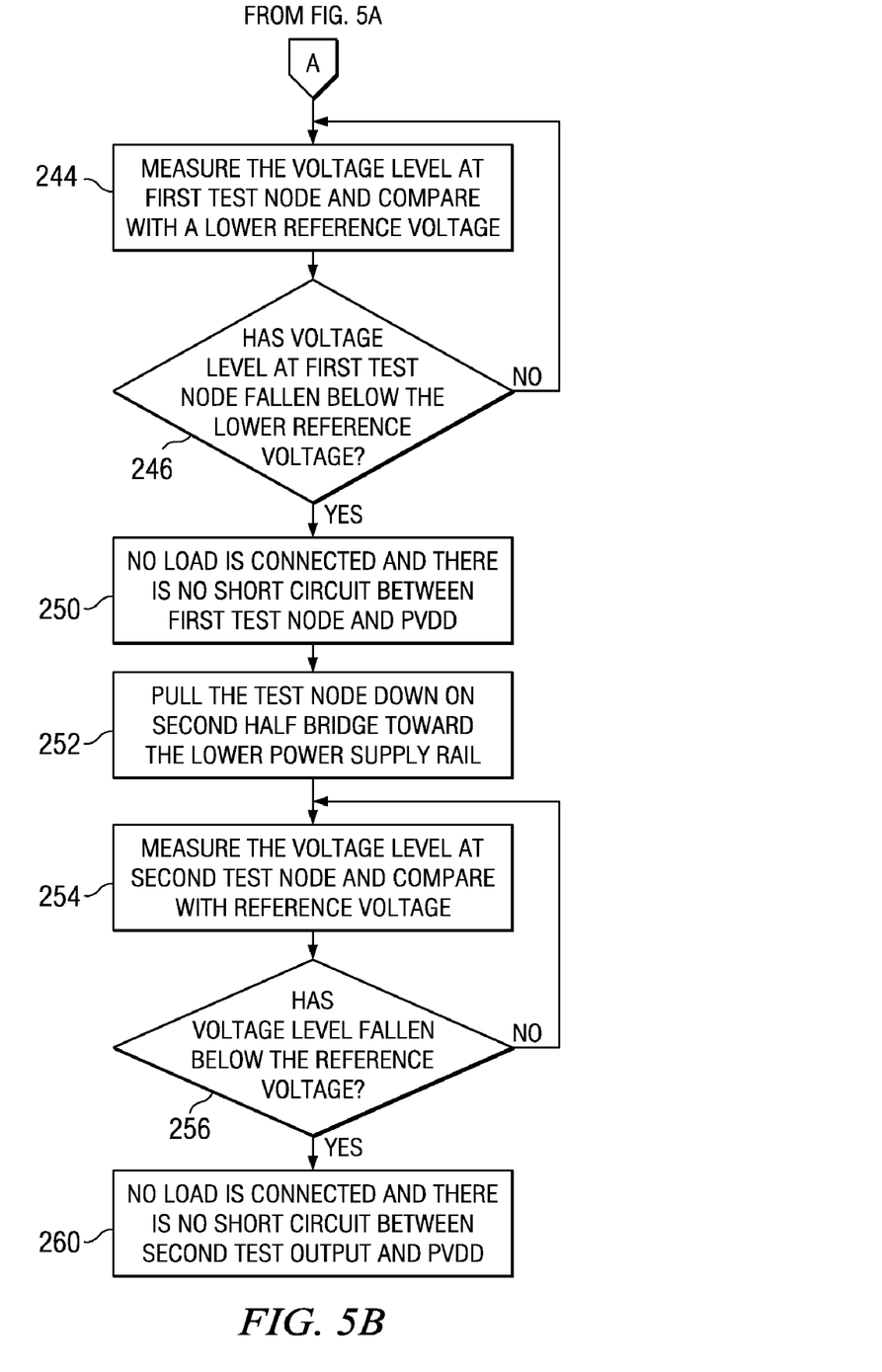

The first stage of the method is performed as in other embodiments. The voltage levels at both test nodes 132 and 134 are monitored and compared with reference voltages to determine when they have risen above the reference voltages. (Blocks 230 and 232) As described above, this will not take place until power has been applied to the gate drivers (e.g., 156) and to PVDD 146. Furthermore, the tests are performed with the output transistors 136, 140, 142 and 144 turned off. When the voltage levels have risen above the reference voltages, that is, the second test node 132 is above reference voltage 174 or 2.0V, and the first test node 134 is above reference voltage 176 or 1.5V, the test node 134 on the first half bridge 110 is pulled down (block 234) and comparator 170 monitors the voltage at the second test node 132 to determine whether it has fallen below reference voltage 174 or 2.0V. (Blocks 236 and 240) If it does, the test passes with the load connected and no short circuits between either test node 132 or 134 and PVDD 146. The comparator 172 simultaneously monitors the voltage at the first test node 134 to determine whether it has fallen below reference voltage 176 or 1.5V. (Blocks 244 and 246) It is given that the voltage at the second test node 132 is still above reference voltage 174, because otherwise the test would have passed at block 240. (Measurements of the first and second test nodes 134 and 132 are performed in parallel, starting at the same time when the test node 134 on the first half bridge 110 is pulled down and continuing until the first of the two voltages falls below their reference voltages.) Because reference voltage 174 is higher than reference voltage 176, this means that there is a significant voltage difference between test nodes 132 and 134, indicating that no load is connected and there is no short from the first test node 134 to PVDD 146. (Block 250) A potential short between the second test node 132 and PVDD 146 may then be detected by turning on the pulldown transistor (not shown) for the second test node 132 in half bridge 106 (block 252), measuring the voltage at switching output 132 and waiting for it to fall below reference voltage 174. (Blocks 254 and 256) It is given that the voltage at the second test node 132 has not already fallen below reference voltage 174 or it would have passed at block 240. If the voltage at the second test node 132 falls below reference voltage 174 after the pulldown transistor in half bridge 106 is turned on, there is no short from the second test node 132 to PVDD 146, and it is safe to start the amplifier, though it has been verified that no load is present. (Block 260) If the voltage at the second test node 132 does not fall below reference voltage 174 because the second test node 132 is shorted to PVDD 146, the amplifier is kept inactive until the short is repaired and the tests are successfully passed.

In conclusion, the present invention provides novel apparatuses and methods for detecting short circuits and loads in circuits such as a class D amplifier. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for testing an amplifier having a first output and a second output, the apparatus comprising:
    an upper power supply rail;
    a lower power supply rail;
    a first driver that is coupled to the upper power supply rail, wherein the first driver includes an output;
    a first filter that is coupled between the output of the first driver and a first output of the amplifier, wherein the first filter is operable to produce a demodulated output signal from a higher frequency modulated signal at the output of the first driver;
    a first voltage level detector that is coupled to the output of the first driver;
    a second driver that is coupled to the upper power supply rail, wherein the second output driver includes an output;
    a second filter that is coupled between the output of the second driver and the second output of the amplifier;
    a second voltage level detector that is coupled to the output of the second driver;
    a pulldown switch that is coupled between the output of the first driver and the lower power supply rail; and
    a control circuit operable to detect at least one fault based on a voltage level measured at one or more of the outputs from the first and second drivers by the first and second voltage level detectors.

2. The apparatus of claim 1, wherein the control circuit is operable to test the amplifier when power has been applied to the first driver and before an input signal has been applied to the first driver.

3. The apparatus of claim 1, wherein the apparatus further comprises:
    a first gate driver that is coupled to a control input of the first driver; and
    a second gate driver that is coupled to a control input of the second driver, wherein the control circuit is operable to test the amplifier when power has been applied to the first gate driver and before an input signal has been applied to the first driver.

4. The apparatus of claim 3, wherein the control circuit is operable to detect whether a short to the lower power supply rail prevents the first voltage level at the first driver output from rising due to the power applied to the first gate driver.

5. The apparatus of claim 1, wherein the apparatus further comprises a resistor that is coupled between the pulldown switch and the lower power supply rail.

6. The apparatus of claim 1, wherein the pulldown switch further comprises a transistor that is coupled to the control circuit at its gate, wherein the control circuit is operable to turn on the transistor to pull the driver output down to the lower power supply rail and to determine whether the driver output is held above a reference voltage level by a short to the upper power supply rail.

7. The apparatus of claim 1, wherein the first voltage level detector further comprises a comparator having a first input that is coupled to the output of the first driver, a second input that is coupled to a reference voltage source, and an output that is coupled to the control circuit.

8. The apparatus of claim 1, wherein the control circuit is operable to disable the amplifier if the at least one fault is detected.

9. The apparatus of claim 1, wherein the first driver further comprises a plurality of transistors coupled in series with one another between the upper and lower power supply rails, and wherein the output of the first driver further comprises a node between the plurality of transistors.

10. A method of testing an amplifier, the method comprising:
    applying power to a first gate driver in a class D amplifier;
    measuring a first voltage level at a first test node at an output of an output stage driver and an input of a first output filter;
    determining a presence of at least one type of fault associated with the class D amplifier based at least in part on the first voltage level measured at the first test node;
    pulling a second test node at an output of a second gate driver down to a lower power supply rail, wherein the second test node is coupled to a second output filter so that the first and second output filters are coupled together in an H bridge; and
    determining whether a voltage level at the second test node falls below a reference voltage.

11. The method of claim 10, wherein the steps of measuring the first voltage level and determining the presence are performed without an input signal applied to the output stage driver.

12. The method of claim 10, wherein the method further comprises disabling the class D amplifier if the presence of at least one type of fault is detected.

13. The method of claim 10, wherein the step of determining the presence further comprises identifying whether a short to the lower power supply rail exists and prevents the first voltage level at the first test node from being pulled above the reference voltage by the first gate driver.

14. The method of claim 10, wherein the method further comprises pulling the first test node down toward a lower power supply rail, and wherein the step of determining the presence further comprises identifying whether a short to an upper power supply rail exists and prevents the first voltage level at the first test node from being pulled below the reference voltage.

15. An apparatus comprising:
    an amplifier having a first driver and a first filter, wherein the first filter is coupled between a first output of the first driver and a first output of the amplifier, and wherein the first filter is operable to produce a demodulated a first output signal from a higher frequency modulated signal at the first driver output;
    a first voltage level comparator having a first input and a second input, wherein the first input of the first voltage level comparator is coupled to the first driver output, and wherein the second input of the first voltage level comparator is coupled to a reference voltage source;

a gate driver coupled to a control input of the first driver;

a control circuit operable to detect at least one fault based on a voltage level measured at the first driver output by the voltage level comparator;

a pulldown switch coupled between the first driver output and a lower power supply rail, wherein the pulldown switch includes a transistor having a gate coupled to the control circuit;

a resistor coupled between the pulldown switch and the lower power supply rail;

a second driver and second filter, wherein the second filter is coupled between an output of the second driver and a second output of the amplifier; and a second voltage level comparator coupled to the output of the second driver, wherein the control circuit is operable to detect a load coupled between the first amplifier output and the second output of the amplifier by turning on the pulldown switch and measuring a voltage level on at least one of the first driver output and second driver output.

* * * * *